(12) United States Patent
Popp et al.

(10) Patent No.: US 7,012,289 B2
(45) Date of Patent: Mar. 14, 2006

(54) MEMORY CELL HAVING A THIN INSULATION COLLAR AND MEMORY MODULE

(75) Inventors: Martin Popp, Dresden (DE); Dietmar Temmler, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/348,148

(22) Filed: Jan. 21, 2003

(65) Prior Publication Data

US 2004/0032027 A1 Feb. 19, 2004

(30) Foreign Application Priority Data

Jan. 21, 2002 (DE) ............... 102 02 139

(51) Int. Cl.
| | | |
|---|---|---|
| H01L 27/108 | (2006.01) | |
| H01L 29/76 | (2006.01) | |
| H01L 29/94 | (2006.01) | |
| H01L 31/119 | (2006.01) | |

(52) U.S. Cl. .................................................. 257/204
(58) Field of Classification Search ............... 257/304; 438/245, 246, 388–90
See application file for complete search history.

(56) References Cited

U.S. PATENT DOCUMENTS

| 4,649,625 A | * | 3/1987 | Lu ............................. 438/245 |
| 4,937,205 A | | 6/1990 | Nakayama et al. |
| 5,250,829 A | | 10/1993 | Bronner et al. |
| 5,344,381 A | | 9/1994 | Cabrera y Lopez Caram |
| 5,843,820 A | | 12/1998 | Lu |

(Continued)

FOREIGN PATENT DOCUMENTS

| DE | 199 41 148 A1 | 4/2001 |
| DE | 100 45 694 A1 | 4/2002 |

OTHER PUBLICATIONS

N.C.C. Lu et al.: "A Buried-Trench DRAM Cell Using A Self-Aligned Epitaxy Over Trench Technology", *IEDM 88*, pp. 588-591.

Frank S. Becker et al.: "Low pressure Deposition of Doped $SiO_2$ by Pyrolysis of Tetraethylorthosilicate (TEOS)", *J. Electrochem. Soc.*, vol. 130, No. 10, Oct. 1989, pp. 3033-3043.

(Continued)

*Primary Examiner*—Howard Weiss
(74) *Attorney, Agent, or Firm*—Laurence A. Greenberg; Werner H. Stemer; Ralph E. Locher

(57) ABSTRACT

A memory cell has a trench capacitor, in which the area required over a terminal area of the trench capacitor is advantageously reduced by the formation of a particularly thin insulation collar. The insulation collar is reduced to such an extent that although a lateral current is prevented, the formation of a parasitic field-effect transistor is permitted. In order that, however, overall no current flows via the parasitic field-effect transistor, a second parasitic field-effect transistor is disposed in a manner connected in series, but is not turned on. This is achieved by the formation of a thicker second insulation collar that isolates the filling of the trench capacitor from the surrounding substrate.

11 Claims, 3 Drawing Sheets

U.S. PATENT DOCUMENTS

| | | | | |
|---|---|---|---|---|
| 5,908,310 | A | * | 6/1999 | Bronner et al. ............. 438/243 |
| 5,936,271 | A | * | 8/1999 | Alsmeier et al. ........... 257/301 |
| 6,236,079 | B1 | * | 5/2001 | Nitayama et al. ........... 257/306 |
| 6,373,091 | B1 | * | 4/2002 | Horak et al. ................. 257/306 |
| 6,381,165 | B1 | * | 4/2002 | Lee et al. ..................... 365/51 |
| 6,664,167 | B1 | * | 12/2003 | Temmler et al. ............ 438/386 |

OTHER PUBLICATIONS

C.M. Ransom et al.: "Shallow $n^+$ Junctions in Silicon by Arsenic Gas-Phase Doping", *J. Electrochem. Soc.,* vol. 141, No. 5, May 1994, pp. 1378-1381.

* cited by examiner

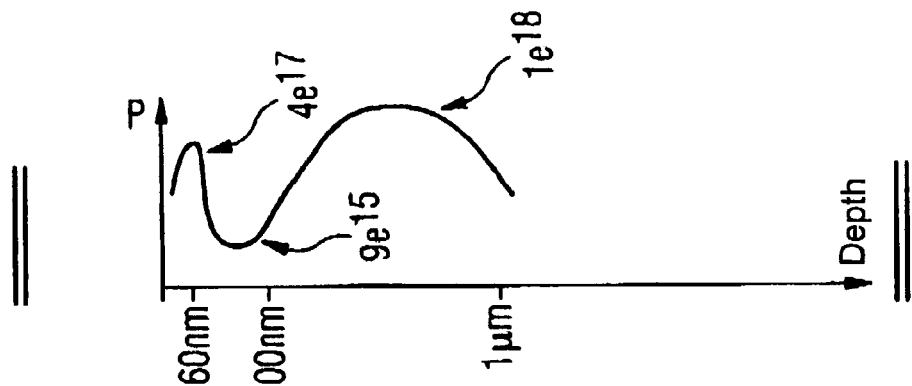
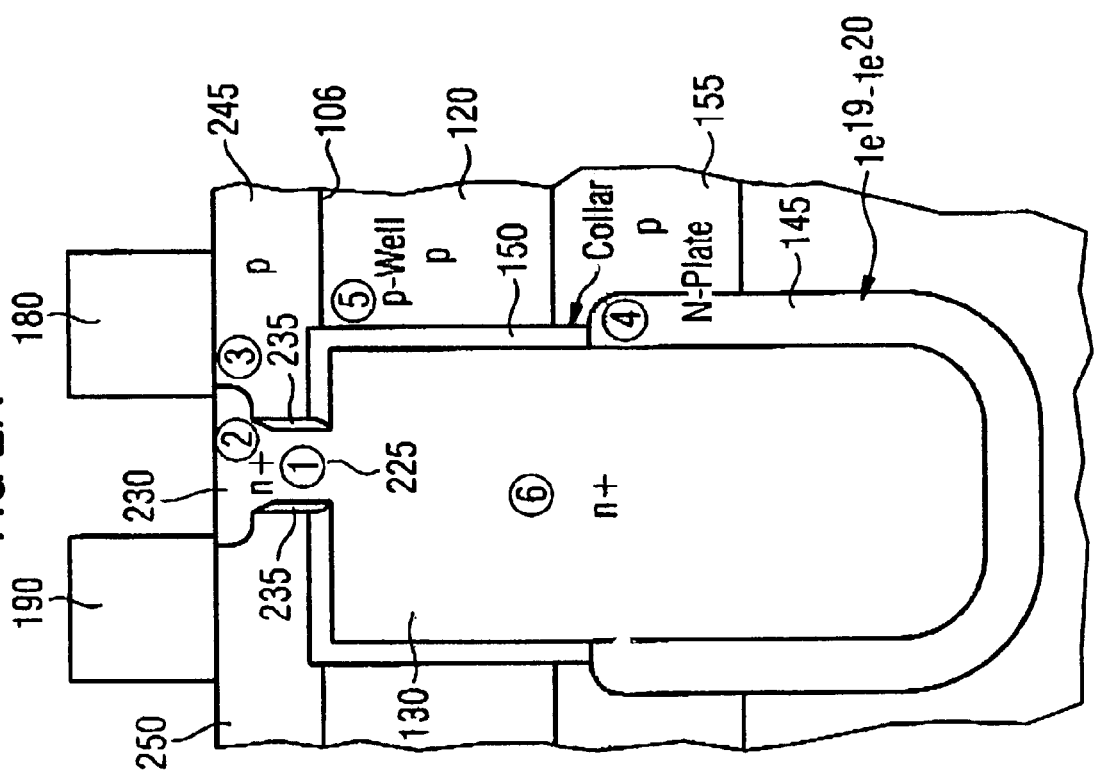
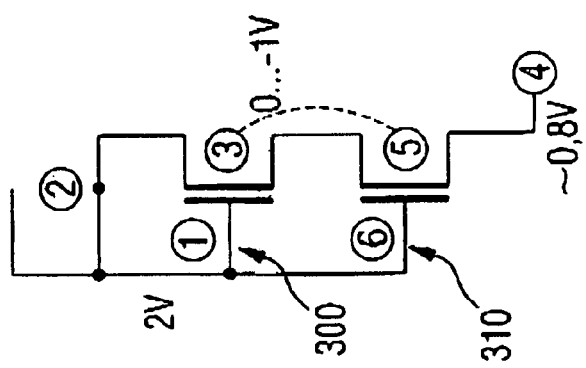

MEMORY CELL HAVING A THIN INSULATION COLLAR AND MEMORY MODULE

BACKGROUND OF THE INVENTION

Field of the Invention

The invention relates to a memory cell that is disposed at least partly in a substrate and has a selection transistor and a trench capacitor. The trench capacitor is formed in a trench of the substrate, and is conductively connected to a terminal of the selection transistor via a contact trench. The contact trench has a smaller cross section than the trench. The trench capacitor has a trench filling and the trench filling is surrounded with a second insulating layer in an upper section. The contact trench has a conductive filling surrounded by a first insulating layer and the first and second insulating layers adjoin one another.

Memory cells are used in semiconductor memories in order to store information about the charge state of a capacitor. A memory cell contains a selection transistor and a capacitor in which the stored information is held. The capacitor is configured, for example, in the form of a trench capacitor or a stacked capacitor.

The embodiment of the memory cell with a trench capacitor affords the advantage that a relatively large volume of the trench capacitor can be disposed in the silicon substrate and the trench capacitor tapers in the direction of the surface of the substrate and adjoins the surface of the substrate with a relatively narrow cross section. This makes it possible to achieve a saving in the surface area required for the formation of the memory cell. Furthermore, the selection transistor is disposed on the surface of the substrate.

Limits are imposed on reducing the cross section of the trench capacitor in the region of the surface owing to the fact that the conductivity of the trench filling in the region of the surface must have a predetermined value. Moreover, the configuration of an insulation collar is necessary in order to electrically insulate the trench filling from the substrate in the upper region as well.

The article titled "Transistor on Capacitor Cell with Quarter Pitch Layout", by M. Sato et al., 2000 Symposium on VLSI Technology Digest of Technical Papers, 2000 IEEE, pages 82 and 83 discloses a memory cell having a trench capacitor, which has a lower wide region and an upper narrow region. The lower wide region is surrounded by a nitride film as an insulation layer. The upper end face of the third region is covered by a thick silicon oxide layer. The narrow region is taken up to the surface of the substrate and is likewise insulated from the substrate by an insulation layer. The known embodiment of the trench capacitor has the disadvantage that the insulation layer that insulates the narrow region has to be made relatively thick in order to avoid the formation of a parasitic field-effect transistor. Consequently, despite the embodiment of the narrow upper region of the trench filling, a relatively large surface region of the substrate surface is required for the formation of the trench capacitor. A memory cell with trench capacitor of the generic type is known. The trench capacitor is configured in the form of a wide lower section and a narrow upper section. However, in this embodiment, too, the narrow upper section has a relatively wide insulation collar. As a result, in this embodiment of the memory cell, too, a relatively large area requirement is necessary for the formation of the memory cell with the trench capacitor.

SUMMARY OF THE INVENTION

It is accordingly an object of the invention to provide a memory cell having a thin insulation collar and a memory module that overcome the above-mentioned disadvantages of the prior art devices of this general type.

With the foregoing and other objects in view there is provided, in accordance with the invention, a memory cell. The memory cell contains a substrate having a trench formed therein and having a given cross section, a selection transistor having a terminal region, and a trench capacitor formed in the trench and having a trench filling with an upper region and a lower region. A first insulating layer is disposed above the trench filling and has a contact trench formed therein. The contact trench has a cross section being smaller than the given cross section of the trench. A conductive filling is disposed in the contact trench and is surrounded by the first insulating layer. The conductive filling conductively connects the terminal region of the selection transistor to the trench capacitor. A second insulation layer surrounds the trench filling in the upper region and adjoins the first insulation layer. The second insulating layer has a second thickness being greater than the first thickness. The first thickness formed for preventing a lateral current flow but a formation of a parasitic field-effect transistor being possible during operation of the memory cell.

The object of the invention is to provide a memory cell having a trench capacitor, the formation of the trench capacitor in the region of the substrate surface requiring a relatively small area and the trench capacitor nevertheless being protected from discharge via parasitic transistors.

An essential advantage of the memory cell according to the invention is that the contact trench has a relatively thin first insulating layer and the trench capacitor has a wide second insulating layer. What is achieved in this way is that no lateral current flow is established between the filling of the contact trench and the surrounding substrate and the relatively thick formation of the second insulation layer prevents an electrical conduction state of a second parasitic field-effect transistor in the region of the second insulation layer. As a result, the leakage current rate of the trench capacitor is reduced overall. In principle, a first parasitic field-effect transistor could form in the region of the first insulation layer and a second parasitic field-effect transistor could form in the region of the second insulation layer. However, the two parasitic field-effect transistors are connected in series and, with the second parasitic field-effect transistor being turned off, a current flow from the trench capacitor into the surrounding substrate is prevented overall.

In accordance with a further feature of the invention, the first thickness is made such that the lateral current flow is avoided. During operation, a first parasitic field effect transistor is formed from the terminal region of the selection transistor, the trench filling, the first insulating layer, the substrate and the doping region is turned on. A second parasitic field effect transistor formed from the doping region, the trench filling, the second insulating layer and the further doping region is not turned on during the operation of the memory cell.

Experiments have shown that preferred results are achieved by forming a thickness of the first insulation layer in the region of <15 nm and forming a thickness of the second insulation layer in the region of >15 nm. Preferably, the thickness of the first insulation layer lies in the range from 7 to 12 nm and the thickness of the second insulation layer lies in the region of approximately 20 nm. However, these values may be altered depending on the configuration and type of doping of the substrate adjoining the first and/or the second insulation layer. What is essential, however, is that the thickness of the second insulation layer is made large enough to reliably prevent the formation of a parasitic field-effect transistor in the region of the second insulation layer. The thickness of the first insulation layer may be chosen to be thin enough to just still prevent lateral currents between the filling of the contact trench and the surrounding substrate. A formation of a parasitic field-effect transistor in the region of the first insulation layer is permissible, however.

Furthermore the memory module has the advantage that a compact configuration of the memory cells with a small surface area is possible.

Preferably, a doping region is formed in the region of the second insulation layer, which doping region has an inverse (opposite) doping with respect to the trench filling. This supports the formation of the series circuit of the two parasitic field-effect transistors.

In a further preferred embodiment, a lower termination region of the trench filling is surrounded by a third insulation layer. A second doping region is formed in a manner adjoining the third insulation layer, which second doping region is provided with an inverse doping in comparison with the first doping region. An efficient formation of the charge capacitance of the trench capacitor is made possible in this way.

In one preferred embodiment, the first doping region is formed essentially at a depth of 51 nm to 1 µm away from the substrate surface. The first doping region adjoins the second doping region. This enables the trench capacitor to be formed compactly.

In a further preferred embodiment of the invention, a plurality of memory cells are disposed in the substrate and the trench capacitors are in each case offset with respect to one another by ¼ of a width of a cell which has two trench capacitors. This results in a compact configuration of the memory cells in the substrate for the formation of a semiconductor memory. In particular, the configuration makes it possible to form trenches with the largest possible opening width relative to the unit area of the cell.

Preferably, a shoulder is disposed in the transition region between the narrow and wide regions of the trench filling, the second insulating layer being formed above the shoulder. In this case, the second insulating layer adjoins the first insulating layer, which is formed in the contact trench and extends downward at the outer side of the trench filling right into the second doping region. Reliable electrical insulation of the trench filling is provided in this way.

In an advantageous embodiment, the third insulating layer has a smaller thickness than the second insulating layer. Moreover, the third insulating layer adjoins the second insulating layer in the region of the second doping region. Reliable insulation of the trench filling is made possible in this way.

Other features which are considered as characteristic for the invention are set forth in the appended claims.

Although the invention is illustrated and described herein as embodied in a memory cell having a thin insulation collar and a memory module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2A is a circuit diagram of parasitic field-effect transistors of the memory cell;

FIG. 2B is a sectional view of the memory cell with the parasitic field-effect transistors;

FIG. 2C is a graph illustrating a doping profile; and

DESCRIPTION OF THE PREFERRED EMBODIMENTS

Figure 1:
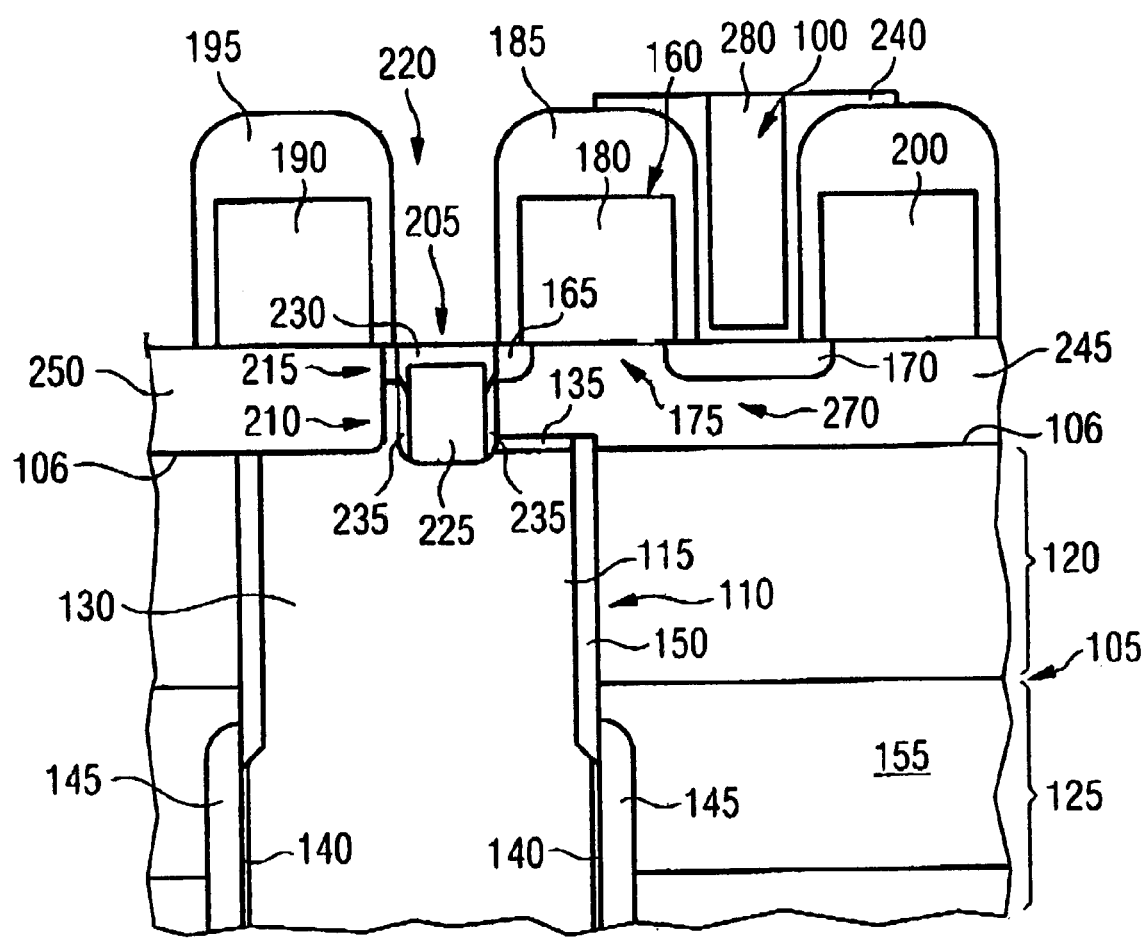
FIG. 1 is a diagrammatic cross-sectional view through part of a semiconductor memory device having a memory cell according to the invention.

Referring now to the figures of the drawing in detail and first, particularly, to FIG. 1 thereof, there is shown an embodiment of the invention. A memory cell 100 contains a trench capacitor 110 and a transistor 160. The trench capacitor 110 is formed in a substrate 105 having a surface 106. A buried well 155, composed e.g. of n-doped silicon, is introduced in the substrate 105, which is composed of p-doped silicon, for example. Boron, arsenic or phosphorus is suitable as a dopant for the doping of silicon. The trench capacitor 110 has a trench 115 with an upper region 120 and a lower region 125. A large insulation collar 150 is situated in the upper region 120 of the trench 115. The lower region 125 of the trench penetrates through the buried well 155 at least partly. A buried plate 145 forming the outer capacitor electrode of the trench capacitor 110 is disposed around the lower region 125 of the trench 115. The buried plates of adjacent memory cells are electrically connected to one another by the buried well 155. The buried well 155 constitutes a second doping region. The buried plate 145 is composed of n-doped silicon, for example, or is doped analogously to the buried well 155.

The lower region 125 of the trench 115 is lined with a dielectric layer 140, which forms the storage dielectric of the trench capacitor 110 and constitutes a third insulation layer. The dielectric layer 140 may be fabricated from layers or layer stacks which contain silicon oxide, silicon nitride or silicon oxynitride. It is also possible to use storage dielectrics having a high dielectric constant, such as e.g. tantalum oxide, titanium oxide, BST (Barium Strontium Titanate), and any other suitable dielectric.

The trench 115 is filled with a conductive trench filling 130, which forms the inner capacitor electrode and is composed of doped polysilicon for example. Situated above the conductive trench filling 130 is an insulating covering layer 135 composed e.g. of silicon oxide. Furthermore, situated above the conductive trench filling 130 is a self-aligned terminal 220, which is disposed in a contact trench 205 having an upper region 215 and a lower region 210. The lower region of the contact trench 205 is lined with an insulation collar 235 and, in this case, surrounds a conductive material 225 disposed on the conductive trench filling 130. An insulation trench constitutes a further insulation layer. In the contact trench 205, a conductive cap 230 is disposed above the insulation collar 235 and the conductive material 225.

The conductive material 225 and the conductive cap 230 are composed of doped polysilicon, for example. The insulation collar 235 is composed e.g. of silicon oxide.

An epitaxial layer 245 is situated above the insulating covering layer 135 and the substrate 105. The transistor 160 is formed in the epitaxial layer 245. The transistor 160 contains a drain region 165 connected to the conductive cap 230. Furthermore, the transistor 160 contains a source region 170 and a channel 175, which are likewise formed in the epitaxial layer 245. The source region 170 and the drain region 165 are formed from doped silicon, for example.

Situated above the channel 175 of the transistor 160 is a first word line 180, which is lined by a first insulation encapsulation 185 composed of silicon nitride, for example. A trench isolation 250 is disposed above the trench 115, beside the contact trench 205. In this exemplary embodiment, the trench isolation 250 is composed of silicon oxide. A second word line 190 lined by a second insulation encapsulation 195 runs above the trench isolation 250. A third word line 200 runs beside the first word line 180. A stop layer 240 is disposed above the word line and the source region 170, which stop layer is removed between the first and second word lines. Between the first and third word lines 180, 200 an insulation filling is applied to the stop layer 240. The stop layer protects the region between the first word line 180 and the third word line 200. An active region 270 is surrounded all around by the trench isolation 250 and is situated in the epitaxial layer 245.

The method for fabricating the memory cell according to the invention is explained with reference to FIG. 1. The substrate 105 is provided, in and on which the DRAM memory cell is to be fabricated. In the case of the present variant, the substrate 105 is lightly doped with p-type dopants, such as e.g. boron. An n-doped, buried well 155 is formed in the substrate 105 at a suitable depth. By way of example, phosphorus or arsenic can be used as a dopant for doping the buried well 155. The buried well 155 may be produced e.g. by implantation and forms a conductive connection between the buried plates of the adjacent capacitors. As an alternative, the buried well 155 may be formed by doped silicon layers grown epitaxially or by a combination of crystal growth (epitaxy) and implantation. This technique is described in U.S. Pat. No. 5,250,829 by Bronner et al.

The trench 115 is formed using a suitable hard mask layer as an etching mask for a reactive ion etching step (RIE). Afterward, the insulation collar 150 composed e.g. of silicon oxide is formed in the upper region 120 of the trench 115. Afterward, the buried plate 145 is formed with n-type dopants, such as e.g. arsenic or phosphorus, as the outer capacitor electrode. In this case, the large insulation collar 150 serves as a doping mask that restricts the doping to the lower region 125 of the trench 115. A gas phase doping, a plasma doping or a plasma immersion ion implantation (PIII) may be used to form the buried plate 145. These techniques are described for example in the reference by Ransom et al., J. Electrochemical. Soc., Volume 141, No. 5 (1994), page 1378 et seq.; U.S. Pat. No. 5,344,381 and U.S. Pat. No. 4,937,205. An ion implantation using the large insulation collar 150 as a doping mask is likewise possible. As an alternative, the buried plate 145 may be formed using a doped silicate glass as dopant source such as e.g. ASG (arsenosilicate glass). This variant is described for example in the reference by Becker et al., J. Electrochemical. Soc., Volume 136 (1989), page 3033 et seq. If doped silicate glass is used for doping, then it is removed after the formation of the buried plate 145.

Afterward, the dielectric layer 140 is formed, which lines the lower region 125 of the trench 115. The dielectric layer 140 serves as a storage dielectric for separating the capacitor electrodes. The dielectric layer 140 contains for example a silicon oxide, a silicon nitride, a silicon oxynitride or a layer stack made of silicon oxide and silicon nitride layers. Materials having a high dielectric constant such as e.g. tantalum oxide or BST can also be used.

Afterward, the conductive trench filling 130, which may be composed of doped polysilicon or amorphous silicon, for example, is deposited in order to fill the trench 115. By way of example, CVD or other known process techniques can be used for this purpose.

The insulating covering layer 135 is formed on the conductive trench filling 130. This can be carried out, e.g. by a thermal oxidation of the conductive trench filling 130. It is also possible to deposit the insulating covering layer 135 onto the conductive trench filling 130. By way of example, CVD deposition methods can be used for this purpose. It is particularly advantageous to form the insulating covering layer 135 selectively on the conductive trench filling 130. The formation of the insulating covering layer 135 can be carried out selectively since, at this point in time, the hard mask layer which was used for the etching of the trench 115 is present on the substrate surface and thus frees only the region in which the insulating covering layer 135 is to be formed.

All the layers that are situated on the surface 106 of the substrate 105 at this point in time are removed and the substrate 105 is cleaned. Afterward, the epitaxial layer 245 is grown epitaxially and selectively on the substrate 105. During the growth of the epitaxial layer 245, the insulating covering layer 135 is overgrown with monocrystalline silicon. The insulating covering layer 135 is overgrown with monocrystalline silicon from all directions. Selective epitaxial growth is described, e.g. in the publication by N.C.C. Lou, IEDM 1988, page 588 et seq.

Afterward, a reflow process is preferably carried out, i.e. an in-situ planarization is carried out in the course of deposition under a hydrogen gas flow at 900° C. to 1000° C., the epitaxial layer 245 grown being planarized.

Afterward, the trench isolation 250 is formed. For this purpose, corresponding regions of the trench isolation are etched and filled with a dielectric material, such as e.g. silicon oxide, and subsequently planarized. In this case, the active region 270 remains for the subsequent formation of the transistor 160.

After the gate oxide has been fabricated, a doped polysilicon layer is deposited, from which the word lines are formed in a subsequent exposure and etching step. In this case, the first word line 180 is formed on the active region 270 and the second word line 190 is formed on the trench isolation 250. The first word line 180 is surrounded with a first insulation encapsulation 185, while the second word line 190 is surrounded with a second insulation encapsulation 195. The insulation encapsulations are composed of silicon nitride, for example.

Afterward, the drain region 165 and the source region 170 are formed by ion implantation. In this case, the word lines formed from polysilicon with their insulation encapsulations serve as an implantation mask. Since the first word line 180 is disposed in such a way that it runs partly perpendicularly above the insulating covering layer 135, part of the channel 175 of the transistor 160 is situated directly above the insulating covering layer 135, so that the transistor 160 is formed as a partial silicon-on-insulator (SOI) transistor.

Afterward, the stop layer 240 is deposited conformally, so that it covers the insulation encapsulations of the word lines. The stop layer 240 is formed from silicon nitride, for example. An oxide layer is then deposited and planarized back down to the stop layer 240, thereby forming e.g. the insulation filling 280 between the first word line 180 and the third word line 200. Afterward, a window is opened in the stop layer 240 by photolithography and etching. In this case, the stop layer 240 is removed between the first word line 180 and the second word line 190, above the drain region 165. The drain region 165 and the epitaxial layer 245 are etched down to the insulating covering layer 135 by anisotropic plasma etching which is selective with respect to the trench isolation 250 composed of silicon oxide and is selective with respect to the first insulation encapsulation 185 and the second insulation encapsulation 195, which are composed of silicon nitride. On account of its selectivity, the etching stops on the insulating covering layer 135. In addition, the etching is self-aligned since it is laterally delimited by the insulation encapsulations of the word lines and by the trench isolation 250.

Afterward, the uncovered part of the insulating covering layer 135 is removed. This is carried out by a selective etching that selectively removes the insulating covering layer 135 composed of silicon oxide. The selectivity is with respect to the conductive trench filling 130 composed of doped polysilicon, with respect to the epitaxial layer 245 composed of silicon, and with respect to the first and second insulation encapsulations 185 and 195 and the stop layer 240, which is composed of silicon nitride.

An insulation collar 235 is then formed in the lower region 210 of the contact trench 205. For this purpose, a thermal oxidation is carried out and a silicon oxide layer is deposited, from which the insulation collar 235 is formed by anisotropic etching-back (spacer technique). A conductive material 225 is subsequently formed in the insulation collar 235. The conductive material 225 is composed of doped polysilicon, for example, and may be deposited by a CVD method.

The insulation collar 235 is etched back selectively down to the depth of the drain region 165. After a cleaning step, the conductive cap 230 is deposited and thus makes contact with the drain region 165 and the conductive material 225. The conductive trench filling 130 is thus electrically connected to the drain region 165 via the conductive material 225. In this configuration, the conductive cap 230 and the conductive material 225 are insulated from the epitaxial layer 245 by the insulation collar 235, so that the trench capacitor cannot be discharged by leakage currents.

The insulation collar 235 preferably has a thickness of less than 15 nm. A preferred value lies in the range from 5 to 12 nm. Particularly good results are achieved with a thickness of approximately 7 nm for the insulation collar 235. The function of the insulation collar 235 is to prevent a lateral current between the conductive material 225 and the epitaxial layer 245. The formation of a parasitic field-effect transistor between the drain region 165 and the upper region of the substrate 105 is permitted in this case, the conductive material 225 serving as a gate electrode. The substrate 105 is highly positively doped in the upper region 120. A first doping region is formed in this way.

On the other hand, the large insulation collar 150 has a layer thickness of >15 nm and <50 nm. Preferred values are achieved for a layer thickness of approximately 20 nm. The task of the large insulation collar 150 is both to prevent a lateral current between the trench filling 130 and the surrounding substrate 105 and to prevent the formation of a parasitic field-effect transistor adjoining the large insulation collar 150. This is reliably achieved by the insulation collar 150 having a correspondingly sufficient thickness.

FIG. 2A shows a diagrammatic illustration of an electrical equivalent circuit diagram of the trench capacitor 110 of FIG. 1. In addition, FIG. 2C illustrates the doping profile of the epitaxial layer 245 and of the substrate 105 for the upper region 120 of the substrate 105. In this case, the epitaxial layer 245 is highly positively doped up to a value of $4 \times 10^{17}$ $cm^{-3}$, measured at a depth of 60 nm from the surface of the epitaxial layer 245. Starting from a depth of 60 nm, the doping profile falls very sharply down to a value of $9 \times 10^{16}$ $cm^{-3}$. Starting approximately from the surface 106 of the substrate, the positive doping rises very sharply up to a value of $1 \times 10^{18}$ $cm^{-3}$ which is reached approximately in the center of the upper region 120 of the substrate 105. In this way, a p-conducting first doping region is formed in the substrate 105 in the region of the upper region 120.

In addition to the diagrammatic illustration of the trench capacitor 110, an electrical equivalent circuit diagram of the trench capacitor 110 is illustrated in FIG. 2A. A series circuit of two parasitic field-effect transistors 300, 310 is formed at the trench capacitor 110. A first parasitic field-effect transistor 300 is represented by the conductive material 225 as the gate electrode, the insulation collar 235 as gate oxide, the drain region 165 as first terminal and the highly positively doped region of the substrate 105 as channel and the buried n-doped well 155 with the buried plate 145 as the second terminal. Adjoining the insulation collar 135, a conduction channel can be formed in the region of the epitaxial layer 245. In the representation chosen, the gate electrode is represented by the number 1, the first terminal is represented by the number 2, the second terminal is represented by the number 5 and the region of the channel is represented by the number 3.

Furthermore, the second parasitic field-effect transistor 310 is connected in series whose gate electrode is represented by the trench filling 130, whose first terminal is represented by the region of the substrate 105 which is doped in a highly p-conducting manner, whose second terminal is represented by the well 155. Adjoining the insulation collar 150, a conduction channel may be formed in the region of the substrate 105. The first terminal is diagrammatically identified by the number 5, the second terminal by the number 4 and the gate terminal by the number 6.

The representation reveals that the two parasitic field-effect transistors are connected in series. Thus, to inhibit the parasitic conduction current, it suffices for at least one parasitic field-effect transistor to be turned off. Since, particularly in the upper region, a small width is advantageous for the formation of the contact trench 205, the formation of a parasitic field-effect transistor in the contact trench 205 is permitted, as a result of which the insulation collar 235 can be made particularly thin.

However, in order that no leakage current can flow overall, the gate oxide of the second parasitic field-effect transistor, which is represented by the large insulation collar 150, is made particularly thick. This reliably prevents the formation of a conduction channel in the region of the large insulation collar 150 together with a sufficiently high p-type doping of the upper region 120 of the trench 115. Consequently, the two parasitic field-effect transistors connected in series are turned off overall.

On account of the formation of the two parasitic field-effect transistors, it is possible to form a particularly thin insulation layer as the insulation collar 235. An enlarged cross section thus remains for the conductive material 225. Consequently, the cross section required by the conductive material 225 and the insulation collar 235 can be made relatively small overall. As a result, particularly little surface area is required to form a terminal for making contact with the trench capacitor 110.

The invention has been described using the example of a substrate doped in a p-conducting manner and an epitaxial layer 245 doped in a p-conducting manner. However, the invention can also be embodied with inverse polarity. In this case, in accordance with the embodiment of FIG. 1, n-doped regions become p-doped and p-doped regions are correspondingly formed in n-doped fashion. The method of operation of the memory cell is maintained overall, however.

Figure 3:
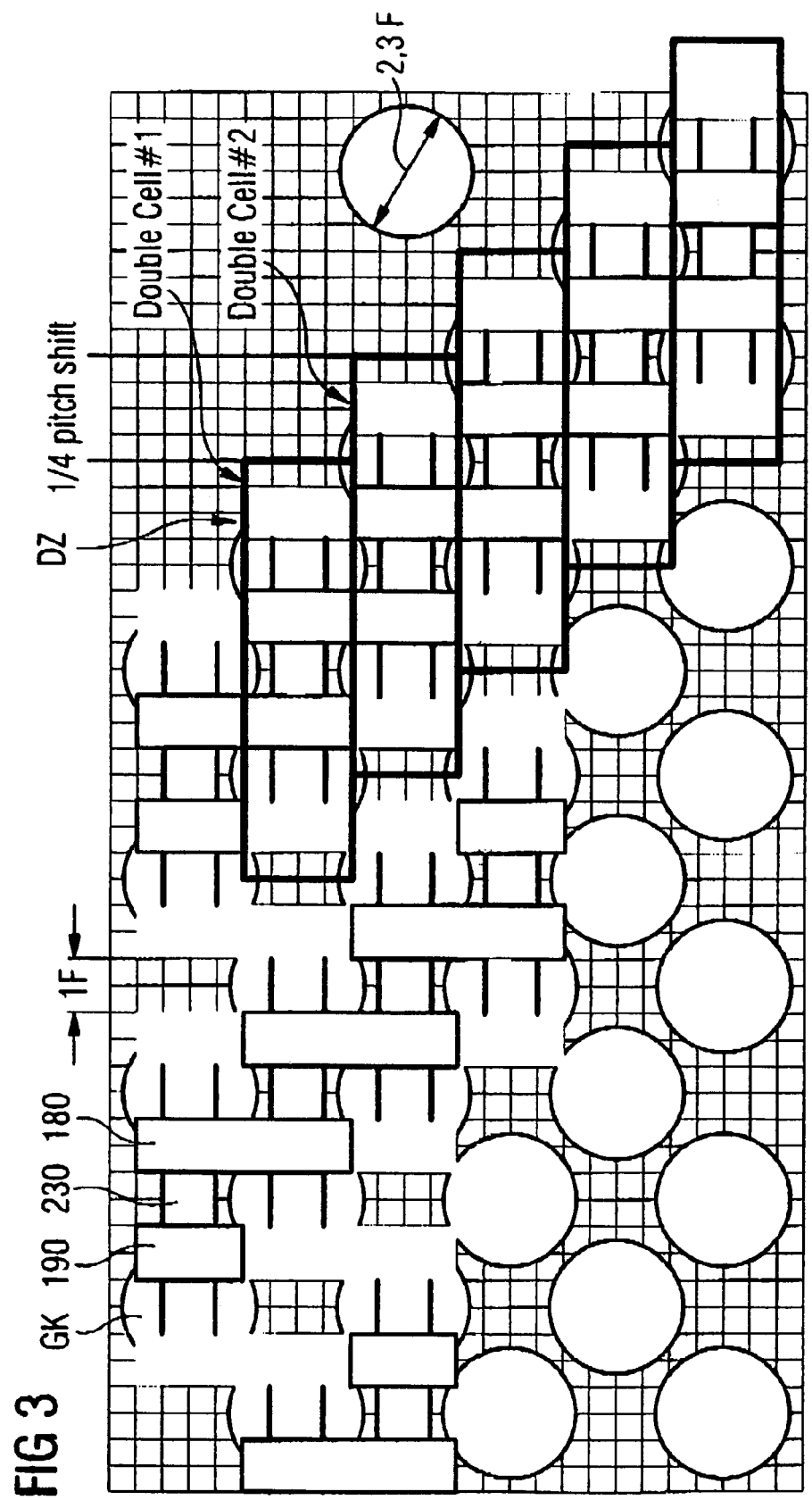
FIG. 3 is a plan view from above of a multiplicity of memory cells disposed in the form of a quarter pitch layout.

FIG. 3 shows a view from above of a memory module such as e.g. a DRAM with a multiplicity of memory cells disposed in the form of a ¼ pitch layout. In this case, trench capacitors GK of two successive rows are offset by a quarter of the length of a double cell DZ. Consequently, the trench capacitors of a first row are in each case disposed centrally between two adjacent memory cells of a second row.

This embodiment affords the advantage that the trenches of the trench capacitors can be made larger and rounder in cross section. The trenches are preferably made round in cross section. In this case the diameters of the trenches reach values of up to 2.3 F, where F represents the minimum size that can be imaged with the technology used.

We claim:

1. A memory cell, comprising:
a substrate having a trench formed therein and having a given cross section;
a selection transistor having a terminal region;
a trench capacitor formed in said trench and having a trench filling with an upper region and a lower region;
a first insulating layer disposed above said trench filling and having a contact trench formed therein, said contact trench having a cross section being smaller than said given cross section of said trench, said first insulating layer having a first thickness being less than 15 nm;
a conductive filling disposed in said contact trench and surrounded by said first insulating layer, said conductive filling conductively connecting said terminal region of said selection transistor to said trench capacitor;
a second insulation layer surrounding said trench filling in said upper region and adjoining said first insulation layer, said second insulating layer having a second thickness being greater than 15 nm which is greater than said first thickness, said first thickness formed for preventing a lateral current flow but a formation of a parasitic field-effect transistor being possible during operation of the memory cell;
a doping region formed in said substrate in a region of said second insulation layer, said trench filling having a doping of a first conductivity type, said doping region having a doping of a second conductivity type, being opposite said first conductivity type, said second insulation layer extending over an entire width of said doping region;
a third insulating layer disposed around said lower region of said trench filling;
a further doping region formed in a manner adjoining said third insulating layer, said further doping region having a doping of said first conductivity type;
said first thickness of said first insulating layer set for preventing the lateral current flow;
during operation, a first parasitic field effect transistor formed from said terminal region of said selection transistor, said conductive filling, said first insulating layer, said substrate and said doping region being turned on; and
a second parasitic field effect transistor formed from said doping region, said trench filling, said second insulating layer and said further doping region not being turned on during the operation of the memory cell.

2. The memory cell according to claim 1, further comprising an epitaxial layer disposed adjacent said first insulating layer, said epitaxial layer being a positively doped epitaxial layer, said epitaxial layer disposed on said substrate adjacent to said second insulating layer, the memory cell having a doping profile falling in said epitaxial layer in a direction of said substrate and than rising up to a given value in said doping region formed in an upper region of said substrate.

3. The memory cell according to claim 2, wherein said epitaxial layer has a doping profile with a maximum doping of about $4 \times 10^{17}$ cm−3, said doping profile of said epitaxial layer falling to about $9 \times 10^{16}$ cm−3 toward said substrate.

4. The memory cell according to claim 3, wherein said doping region has a positive doping rising sharply approximately from a surface of said substrate to a value of about $1 \times 10^{18}$ cm−3 which is reached approximately at a center of said upper region of said substrate.

5. The memory cell according to claim 1, wherein said doping region being substantially formed at a depth of 150 nm to 1 $\mu$m from a surface of said substrate, said doping region ending substantially at a depth at which said further doping region begins.

6. The memory cell according to claim 1, wherein a shoulder is defined in a transition region between said trench and said contact trench, said second insulating layer formed in a region of said shoulder and adjoins said first insulating layer, said second insulating layer extending over said trench filling and is taken downward a predetermined distance along said trench filling.

7. The memory cell according to claim 6, wherein said third insulating layer has a smaller thickness than said second insulating layer, said third insulating layer adjoining said second insulating layer in said lower region of said trench, and said further doping region adjoining said third insulating layer.

8. The memory cell according to claim 1, wherein said first thickness of said first insulating layer is in a range of 7 to 12 nm.

9. A memory module, comprising:
a substrate having trenches formed therein and each having a given cross section;
memory cells disposed in rows, said memory cells of two of said rows disposed offset relative to one another such that said memory cells of a first row being disposed between in each case two of said memory cells of a second row, said memory cells each containing:
a selection transistor having a terminal region;
a trench capacitor formed in one of said trenches and having a trench filling with an upper region and a lower region;
a first insulating layer disposed above said trench filling and having a contact trench formed therein, said contact trench having a cross section being smaller than said given cross section of a respective one of said trenches, said first insulating layer having a first thickness;
a conductive filling disposed in said contact trench and surrounded by said first insulating layer, said conductive filling conductively connecting said terminal region of said selection transistor to said trench capacitor; and a second insulation layer surrounding said trench filling in said upper region and adjoining said first insulation layer, said second insulating layer having a second thickness being greater than said first thickness, said first thickness formed for preventing a lateral current flow but a formation of a parasitic field-effect transistor being possible during operation of the memory cell;

a doping region formed in said substrate in a region of said second insulation layer, said trench filling having a doping of a first conductivity type, said doping region having a doping of a second conductivity type, being opposite said first conductivity type, said second insulation layer extending over an entire width of said doping region;

a third insulating layer disposed around said lower region of said trench filling;

a further doping region formed in a manner adjoining said third insulating layer, said further doping region having a doping of said first conductivity type;

said first thickness of said first insulating layer set for preventing the lateral current flow;

during operation, a first parasitic field effect transistor formed from said terminal region of said selection transistor, said conductive filling, said first insulating layer, said substrate and said doping region being turned on; and a second parasitic field effect transistor formed from said doping region, said trench filling, said second insulating layer and said further doping region not being turned on during the operation of the memory cell.

10. The memory cell according to claim 9, wherein said first thickness is less than 15 nm and said second thickness is greater than 15 nm.

11. A memory module, comprising:

a substrate having trenches formed therein and each having a given cross section;

memory cells each containing:

a selection transistor having a terminal region;

a trench capacitor formed in one of said trenches and having a trench filling with an upper region and a lower region;

a first insulating layer disposed above said trench filling and having a contact trench formed therein, said contact trench having a cross section being smaller than said given cross section of a respective one of said trenches, said first insulating layer having a first thickness;

a conductive filling disposed in said contact trench and surrounded by said first insulating layer, said conductive filling conductively connecting said terminal region of said selection transistor to said trench capacitor; and a second insulation layer surrounding said trench filling in said upper region and adjoining said first insulation layer, said second insulating layer having a second thickness being greater than said first thickness, said first thickness formed for preventing a lateral current flow but a formation of a parasitic field-effect transistor being possible during operation of the memory cell;

a doping region formed in said substrate in a region of said second insulation layer, said trench filling having a doping of a first conductivity type, said doping region having a doping of a second conductivity type, being opposite said first conductivity type, said second insulation layer extending over an entire width of said doping region;

a third insulating layer disposed around said lower region of said trench filling;

a further doping region formed in a manner adjoining said third insulating layer, said further doping region having a doping of said first conductivity type;

said first thickness of said first insulating layer set for preventing the lateral current flow;

during operation, a first parasitic field effect transistor formed from said terminal region of said selection transistor, said conductive filling, said first insulating layer, said substrate and said doping region being turned on;

a second parasitic field effect transistor formed from said doping region, said trench filling, said second insulating layer and said further doping region not being turned on during the operation of the memory cell; and said trench capacitors disposed offset in a form of a ¼ pitch pattern with respect to each other.

* * * * *